(12) United States Patent
Lee

(10) Patent No.: US 10,225,956 B1
(45) Date of Patent: Mar. 5, 2019

(54) CASING FOR REDUCING AIRFLOW RESISTANCE, COOLING DEVICE, AND SERVER USING THE SAME

(71) Applicant: HONGFUJIN PRECISION ELECTRONICS (TIANJIN) CO., LTD., Tianjin (CN)

(72) Inventor: Chia-Chen Lee, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 15/963,178

(22) Filed: Apr. 26, 2018

(30) Foreign Application Priority Data

Feb. 7, 2018 (CN) .......................... 2018 1 0121758

(51) Int. Cl.
*H05K 7/20* (2006.01)
*H05K 7/14* (2006.01)
*G11B 33/14* (2006.01)

(52) U.S. Cl.
CPC ....... *H05K 7/20727* (2013.01); *G11B 33/142* (2013.01); *H05K 7/1487* (2013.01); *H05K 7/20145* (2013.01); *H05K 7/20172* (2013.01)

(58) Field of Classification Search
CPC combination set(s) only.
See application file for complete search history.

(56) References Cited

U.S. PATENT DOCUMENTS

| 5,313,362 | A  | * | 5/1994 | Hatada | G06F 1/203 165/80.3 |
| 9,265,181 | B2 | * | 2/2016 | Tang | H05K 7/20781 |
| 9,769,958 | B2 | * | 9/2017 | Jaskela | H05K 7/20718 |
| 10,026,454 | B2 | * | 7/2018 | Davis | G11B 33/128 |
| 2005/0195568 | A1 | * | 9/2005 | Shyr | G06F 1/20 361/695 |
| 2013/0094140 | A1 | * | 4/2013 | Yen | G06F 1/20 361/679.48 |

* cited by examiner

*Primary Examiner* — Lisa Lea-Edmonds
(74) *Attorney, Agent, or Firm* — ScienBiziP, P.C.

(57) ABSTRACT

A cooling device applied to a server or other casing reduces airflow resistance. A covered chassis defines a accommodating groove and includes two opposite ends, an air inlet located at one end and an air outlet located at the other end, the air outlet communicating with the air inlet. The cover of the chassis is mounted adjacent a side of the chassis and seals the accommodating groove. The cover defines first and second openings corresponding to the accommodating groove. Part of cooling air exits the casing through the accommodating groove and the air outlet, the rest of the cooling air exits the casing through the first opening, re-enters the casing through the second opening and exits the casing through the air outlet.

20 Claims, 4 Drawing Sheets

CASING FOR REDUCING AIRFLOW RESISTANCE, COOLING DEVICE, AND SERVER USING THE SAME

FIELD

The subject matter herein generally relates to the cooling of electronic devices.

BACKGROUND

Electronic products, such as computers or servers, are becoming thinner, causing their inner spaces to become smaller. For example, in a server, electronic components, such as hard disks, occupy most of the inner space and cause high airflow resistance. Therefore, when a cooling fan is operating, the cooling fan must create a high speed airflow in the server to overcome the airflow resistance. However, the operating cooling fan may then cause high-frequency vibration noise and reduce hard disk drive reading and writing efficiencies.

BRIEF DESCRIPTION OF THE DRAWINGS

Implementations of the present disclosure will now be described, by way of example only, with reference to the attached figures.

DETAILED DESCRIPTION

Figure 1:
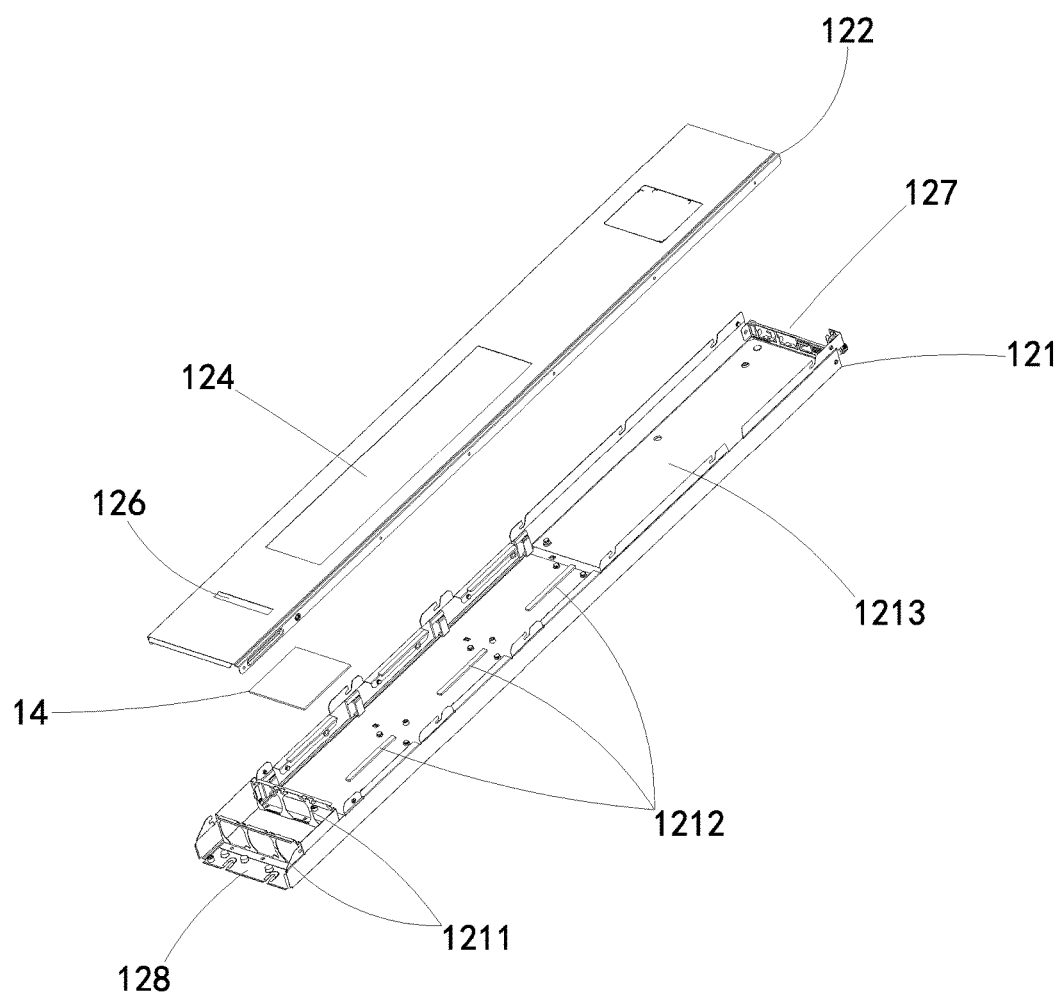
FIG. 1 illustrates an exploded view of an embodiment of a casing for electronic components.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 2:
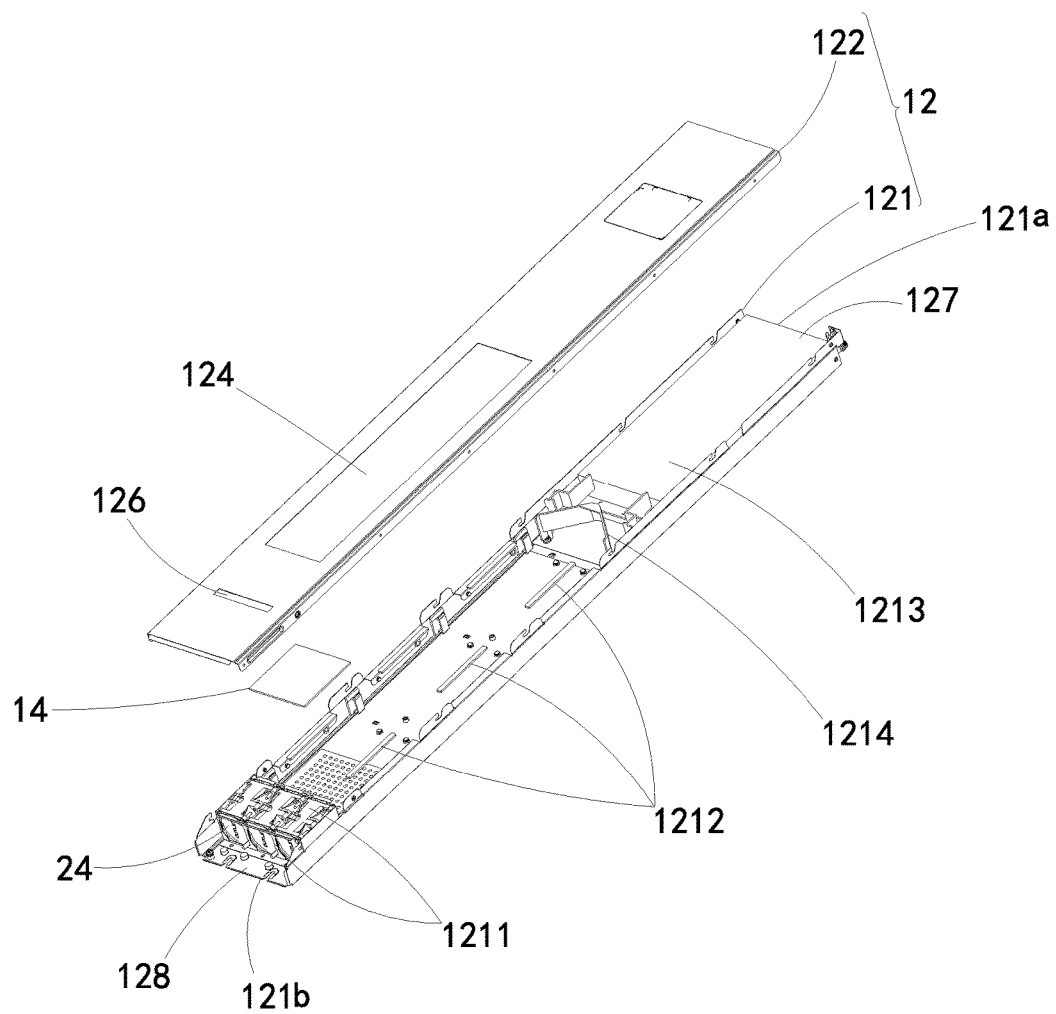
FIG. 2 illustrates an exploded view of an embodiment of a cooling device for the casing of FIG. 1.
Figure 3:
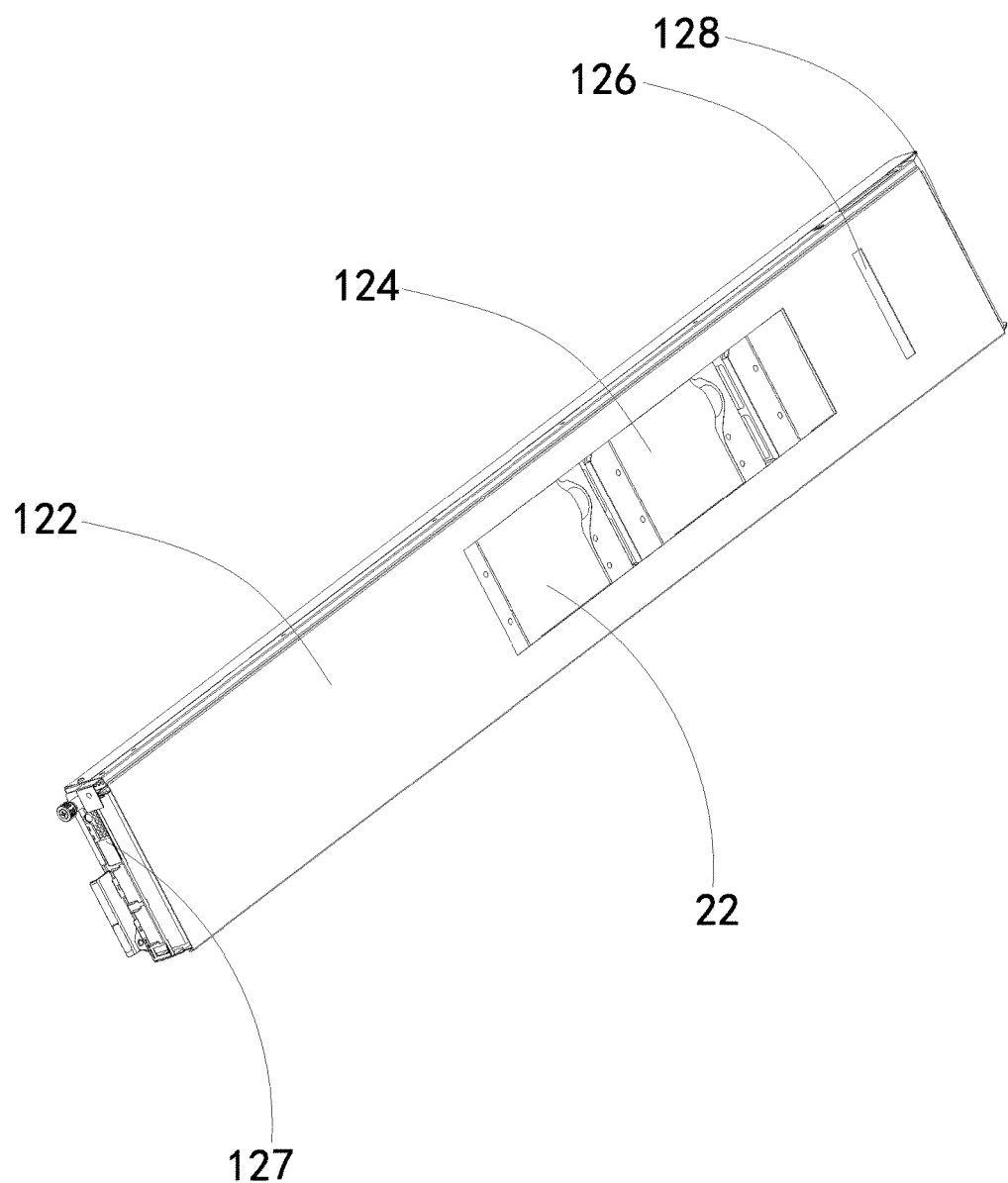
FIG. 3 illustrates an isometric view of an embodiment of a server.
Figure 4:
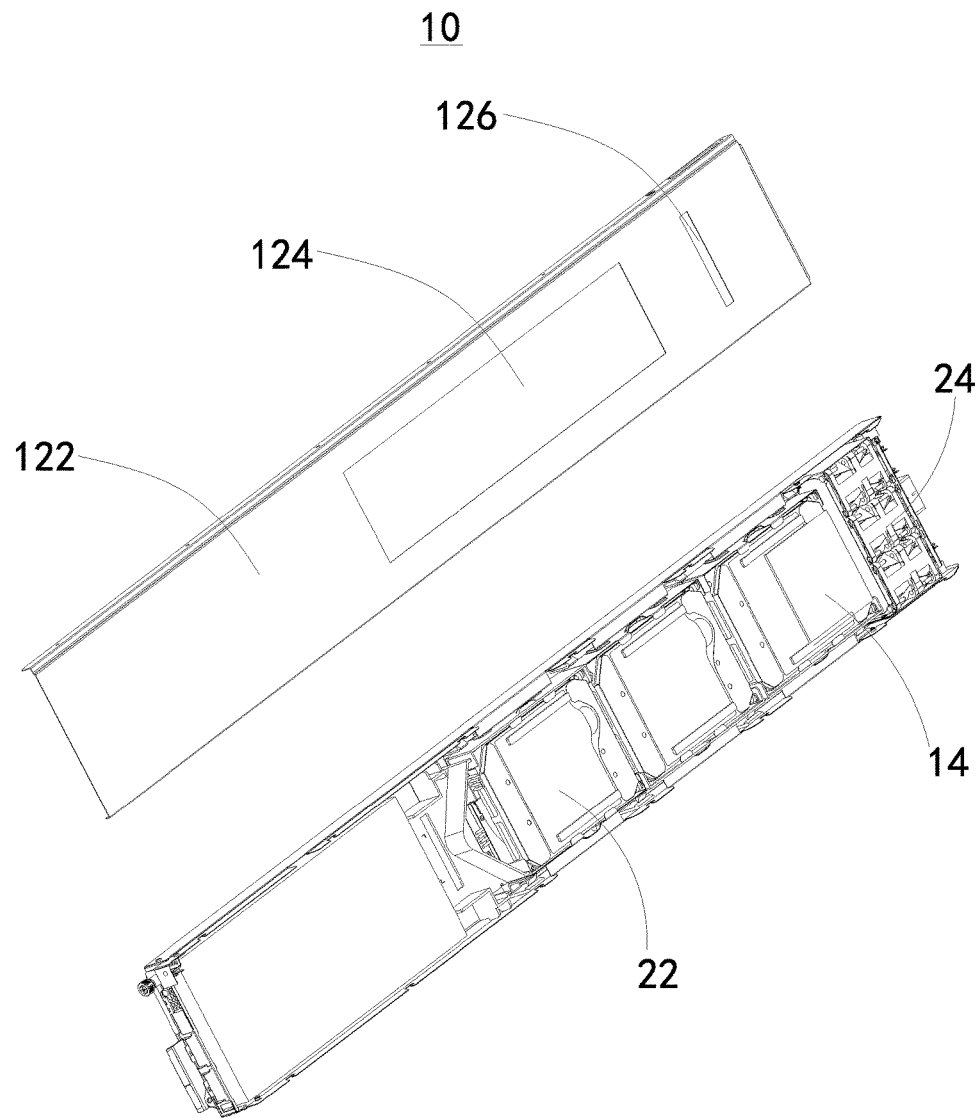
FIG. 4 illustrates an exploded view of the server of FIG. 3.

FIGS. 1 to 4 illustrate a server 10. The server 10 includes a plurality of hard disks 22 (see FIG. 4) and a cooling device 100 (see FIG. 2) for cooling the hard disks 22.

The cooling device 100 includes a casing 12 and at least one cooling fan 24. Airflow resistance in the casing 12 is reduced.

The casing 12 includes a chassis 121 and a cover 122.

The chassis 121 defines an accommodating groove 1213, and the accommodating groove 1213 is configured to accommodate electronic components, such as the hard disks 22. The chassis 121 includes two opposite ends, an air inlet 127, and an air outlet 128. The two opposite ends of the chassis 121 can be a first end 121a and a second end 121b.

The air inlet 127 is located at the first end 121a of the chassis 121, the air outlet 128 is located at the second end 121b of the chassis 121. The air outlet 128 is in fluid communication with the air inlet 127.

The cover 122 is mounted adjacent a side of the chassis 121 and configured to seal the accommodating groove 1213. The cover 122 defines a first opening 124 and a second opening 126. The first opening 124 and the second opening 126 are corresponding to the accommodating groove 1213 and in fluid communication with the accommodating groove 1213.

The cooling fan 24 can be mounted adjacent the air inlet 127 or the air outlet 128. For example, when the cooling fan 24 is a suction fan, the cooling fan 24 is mounted adjacent the air outlet 128.

A cooling air flow through the accommodating groove 1213, entering by the air inlet 127, can cool the hard disks 22. After cooling the hard disks 22, a part of the cooling air flow exits the casing 12 by passing through the accommodating groove 1213 and the air outlet 128. The rest of the cooling air flow exits the casing 12 by passing through the first opening 124, re-enters the casing 12 again through the second opening 126, and exits the casing 12 through the air outlet 128. As described above, the cooling air in the casing 12 can be divided into two parts. One part of the cooling air exits the casing 12 directly, and the flow of the rest of the cooling air is divided. The airflow resistance in the casing 12 is therefore reduced.

In at least one embodiment, the casing 12 can further include a solid block 14. The solid block 14 is attached to an inner surface of the cover 122, and the solid block 14 corresponds to the accommodating groove 1213.

After cooling the hard disks 22, a part of the cooling air exits the casing 12 by passing through the accommodating groove 1213 and the air outlet 128. This part of cooling air is partially blocked by the solid block 14. The flow velocity of the cooling air is reduced, and the airflow resistance in the accommodating groove 1213 is reduced.

The solid block 14 can be located at a rear end, which is adjacent to the air outlet 128 of the accommodating groove 1213. For example, the solid block 14 can be located between the first opening 124 and the second opening 126.

In at least one embodiment, the chassis 121 can further include a first mounting members 1212 configured to mount hard disks 22. The first mounting members 1212 are fixed in the accommodating groove 1213.

The chassis 121 can also include a second mounting member 1211 configured to mount a cooling fan 24. The second mounting member 1211 is fixed in the air outlet 128.

The chassis 121 can be a cubic box with an open side, and the cover 122 is mounted adjacent the open side of the chassis 121. The air inlet 127 and the air outlet 128 are located at opposite lengthwise ends of the cubic box.

The first opening 124 and the second opening 126 can be rectangular and have the same widths. The length of the first opening 124 is larger than the length of the second opening 126.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A casing for reducing airflow resistance, comprising:
a chassis defining a accommodating groove configured to accommodate electronic components, the chassis comprising:
two opposite ends;
an air inlet defined adjacent one end of the chassis; and
an air outlet defined adjacent the other end of the chassis and is in fluid communication with the air inlet; and
a cover mounted adjacent a side of the chassis and configured to seal the accommodating groove, the cover defines a first opening and a second opening, the first opening and the second opening are corresponding to the accommodating groove and in fluid communication with the accommodating groove;
wherein cooling air gets into the accommodating groove through the air inlet, and a part of the cooling air exits the casing through the accommodating groove and the air outlet; and the rest of the cooling air exits the casing through the first opening, and gets into the casing again through the second opening, and exits the casing through the air outlet.

2. The casing of claim 1, wherein the casing further comprises a solid block attached to an inner surface of the cover, and the solid block is corresponding to the accommodating groove.

3. The casing of claim 2, wherein the solid block is located between the first opening and the second opening.

4. The casing of claim 1, wherein the chassis further comprises a first mounting members configured to mount a hard disks, and the first mounting members are fixed in the accommodating groove.

5. The casing of claim 1, wherein the chassis further comprises a second mounting member configured to mount a cooling fan, and the second mounting member is fixed in the air outlet.

6. The casing of claim 1, wherein the chassis is a cuboid box with an open side, and the cover is mounted adjacent the open side of the chassis; and the air inlet and the air outlet are located at two opposite ends of the length direction of the cuboid box.

7. The casing of claim 1, wherein the first opening and the second opening are rectangular openings of same width, and the length of the first opening is larger than the length of the second opening.

8. A cooling device comprising:
a casing for reducing airflow resistance, comprising:
a chassis defining a accommodating groove configured to accommodate electronic components, the chassis comprises two opposite ends and:
an air inlet located at one end of the chassis; and
an air outlet located at the other end of the chassis and is in fluid communication with the air inlet; and
a cover mounted adjacent a side of the chassis, the cover defines a first opening and a second opening, the first opening and the second opening are corresponding to the accommodating groove and in fluid communication with the accommodating groove; and
a cooling fan mounted adjacent the air inlet or the air outlet;
wherein cooling air gets into the accommodating groove through the air inlet, and a part of the cooling air exits the casing through the accommodating groove and the air outlet, the rest of the cooling air exits the casing through the first opening, and gets into the casing again through the second opening and exits the casing through the air outlet.

9. The cooling device of claim 8, wherein the casing further comprises a solid block attached to an inner surface of the cover, and the solid block is corresponding to the accommodating groove.

10. The cooling device of claim 9, wherein the solid block is located between the first opening and the second opening.

11. The cooling device of claim 8, wherein the chassis further comprises a first mounting members configured to mount a hard disks, and the first mounting members are fixed in the accommodating groove.

12. The cooling device of claim 8, wherein the chassis further comprises a second mounting member configured to mount a cooling fan, and the second mounting member is fixed in the air outlet.

13. The cooling device of claim 8, wherein the chassis is a cuboid box with an open side, and the cover is mounted adjacent the open side of the chassis; the air inlet and the air outlet are located at two opposite ends of the length direction of the cuboid box.

14. The cooling device of claim 8, wherein the first opening and the second opening are rectangular openings of same width, and the length of the first opening is larger than the length of the second opening.

15. A server comprising:
a hard disks; and
a cooling device for cooling the hard disks, comprising:
a casing for reducing airflow resistance, comprising:
a chassis defining a accommodating groove configured to accommodate electronic components, the chassis comprises two opposite ends and:
an air inlet located at one end of the chassis; and
an air outlet located at the other end of the chassis and is in fluid communication with the air inlet; and
a cover mounted adjacent a side of the chassis and configured to seal the accommodating groove, the cover defines a first opening and a second opening, the first opening and the second opening are corresponding to the accommodating groove and in fluid communication with the accommodating groove; and
a cooling fan mounted adjacent the air inlet or the air outlet;
wherein cooling air gets into the accommodating groove through the air inlet, and a part of the cooling air exits the casing through the accommodating groove and the air outlet, the rest of the cooling air exits the casing through the first opening, and gets into the casing again through the second opening and exits the casing through the air outlet.

16. The server of claim 15, wherein the casing further comprises a solid block attached to an inner surface of the cover, and the solid block is corresponding to the accommodating groove.

17. The server of claim 16, wherein the solid block is located between the first opening and the second opening.

18. The server of claim 15, wherein the chassis further comprises:
a first mounting members configured to mount a hard disks, and the first mounting members are fixed in the accommodating groove; and a second mounting member configured to mount a cooling fan, and the second mounting member is fixed in the air outlet;

wherein the cooling fan is a suction fan.

19. The server of claim 15, wherein the chassis is a cuboid box with an open side, and the cover is mounted adjacent the open side of the chassis; the air inlet and the air outlet are located at two opposite ends of the length direction of the cuboid box.

20. The server of claim 15, wherein the first opening and the second opening are rectangular openings of same width, and the length of the first opening is larger than the length of the second opening.

\* \* \* \* \*